United States Patent [19]
Song

[11] Patent Number: 5,661,683
[45] Date of Patent: Aug. 26, 1997

[54] ON-CHIP POSITIVE AND NEGATIVE HIGH VOLTAGE WORDLINE X-DECODING FOR EPROM/FLASH

[75] Inventor: Paul Jei-Zen Song, Sunnyvale, Calif.

[73] Assignee: Integrated Silicon Solution Inc., Santa Clara, Calif.

[21] Appl. No.: 596,527

[22] Filed: Feb. 5, 1996

[51] Int. Cl.$^6$ .................................................. G11C 8/00
[52] U.S. Cl. ............................ 365/185.18; 365/189.09; 365/185.23; 365/189.11; 365/230.06
[58] Field of Search ...................... 365/189.09, 185.23, 365/189.11, 230.06, 185.27, 185.33, 185.18

[56] References Cited

U.S. PATENT DOCUMENTS

| | | | |
|---|---|---|---|
| 4,642,798 | 2/1987 | Rao | 365/230 |
| 5,177,745 | 1/1993 | Rozman | 371/21.1 |
| 5,222,046 | 6/1993 | Kreifels et al. | 365/230.06 |
| 5,274,278 | 12/1993 | Bauer et al. | 365/230.06 |
| 5,280,447 | 1/1994 | Hazen et al. | 365/218 |
| 5,365,479 | 11/1994 | Hoang et al. | 365/185.23 |
| 5,394,365 | 2/1995 | Tsukikawa | 365/189.09 |
| 5,506,803 | 4/1996 | Jex | 365/189.09 |
| 5,513,146 | 4/1996 | Atsumi et al. | 254/189.09 |

*Primary Examiner*—David C. Nelms
*Assistant Examiner*—Vu A. Le
*Attorney, Agent, or Firm*—Flehr Hohbach Test Albritton & Herbert LLP

[57] ABSTRACT

An on-chip positive and negative high voltage wordline x-decoding system for EPROM/FLASH is disclosed wherein three transistors are required for each wordline. The x-decoding system minimizes system latch-up by separating the positive and negative high voltage portions of the system. The high-voltage portion of the x-decoding system includes a native mode PMOS transistor fabricated in a N-well on a common P-substrate and a high-voltage NAND gate that supplies a control signal to the gate of the PMOS transistor. In response to a variable power signal (which is at 0 VDC in erase mode, VCC in a read mode, and approximately +10 VDC in program mode) and the control signal (which is low when the memory cell is selected and the system is in read or program modes), the positive portion pulls the selected word line up to VCC and +10 VDC in read and program modes, respectively. The negative voltage portion of the system includes two NMOS transistors fabricated in a P-well within a separate N-well on the common P-substrate. Together, the NMOS transistors pull an unselected word line down to 0 VDC in program/write mode, to 0 VDC in read mode, and pull a selected word line down to –9 VDC in erase mode. In erase mode one of the NMOS transistors pulls an unselected word line down to 0 VDC. Latch-up is prevented by the double well configuration, which separates the positive and negative high-voltage decoding components.

12 Claims, 4 Drawing Sheets

ON-CHIP POSITIVE AND NEGATIVE HIGH VOLTAGE WORDLINE X-DECODING FOR EPROM/FLASH

The present invention relates generally to semiconductor flash memory systems, and more specifically to providing on-chip positive and negative high voltage wordline x-decoders for such memory systems.

BACKGROUND OF THE INVENTION

Solid state and so-called flash memories are known in the art. An individual flash memory cell includes a metal-oxide-semiconductor ("MOS") device having spaced-apart drain and source regions fabricated on a substrate and defining a channel region therebetween. A very thin gate oxide layer overlies the channel region, and a floating charge-retaining storage gate overlies the channel region and is unconnected to the cell. A control gate at least partially overlies the floating gate and is insulated therefrom.

In practice, a plurality of such memory cells is arrayed in addressable rows and columns to form a flash memory array. Individual cells in the array are accessed for purposes of writing, reading or erasing data by decoding row and column information.

Typically, the control gates for a group of cells in a given row are formed from a continuous strip of conductive material that defines a so-called word line, abbreviated "WL". A word line might comprise, for example, a group of eight cells that collectively store one byte. For a given column in the array, the drain leads of all cells in the column are coupled to a so-called bit line, abbreviated "BL". The source leads of the various cells are collectively switchably coupled to one of several potential levels, depending upon whether cells in the array are to be programmed (written) or erased or are to be read.

Within the memory array, an individual cell is addressed and thus selected for reading, programming (writing) or erasing by specifying its row (or word line) as an x-axis coordinate, and its column (or bit line) as a y-axis coordinate. A 16 K-bit memory, for example, may comprise an array of 128×128 bits, in which there are 128 x-axis word lines and 128 y-axis bit lines. Commonly, blocks of memory cells are collectively grouped into sectors. Cell addressing is accomplished by coupling address bits to precoding x-decoders and to precoding y-decoders whose respective outputs are coupled to word lines and bit lines in the array.

Programming an addressed MOS memory cell occurs in a program mode by accelerating so-called hot electrons (from the device substrate). These electrons are injected from the drain region through the thin gate oxide and onto the floating gate. The control gate-source threshold voltage required before substantial MOS device drain-source current occurs is affected by the amount of such charge retained on the floating gate. Thus, storage cell programming forces the floating storage gate to retain charge that will cause the cell to indicate storage of either a logical "1" or "0" in a read-out mode.

The above-described storage cells are non-volatile in that the charge on the storage gate, and thus the "0" or "1" bit stored in the cell, remains even when control and operating voltages to the array are turned off. In the program (write) mode, the control gate is coupled to a high positive potential of perhaps +10 VDC, the drain is coupled to perhaps +6 VDC, and the source and substrate are grounded (meaning that they are coupled to the circuit ground node). This causes the hot electrons to be generated and captured by the floating gate.

In a read mode, the charge stored on the floating gate of an addressed MOS memory cell is read by coupling perhaps +5 VDC to the control gate, and reading drain-to-source current. The presence or absence of charge on the stored gate will define a binary "1" or "0" bit that is read-out from the addressed memory cell by a sense amplifier coupled to the bit line.

In an erase mode, the electrons trapped on the floating gates of a group of addressed MOS memory cells are encouraged to flow by electron tunneling to the source. During this erase mode, a group of negative erase word line decoders cause the addressed cells' control gates to be coupled to perhaps −9 VDC, the sources to perhaps +5 VDC, the drains to float, with the substrates being grounded. In a flash memory configuration, entire sector-sized blocks of cells may be simultaneously erased, e.g., erased in a "flash".

In the various read, program or erase modes, the word lines (e.g., control gates) are pulled up or down to the appropriate voltage levels by x-decoder circuitry. One portion of such circuitry, a positive-side word line decoder, pulls selected word lines up to VCC during normal read mode and to the larger positive potential (e.g., +10 VDC) during program mode, and grounds unselected word line sectors. Another portion of the circuitry, a negative-side word line decoder, pulls selected word lines down to a large negative potential (e.g., −10 VDC) during erase mode. There is no DC current path through the word lines in the various modes because the positive and negative decoding circuits never turn on at the same time.

Prior art on-chip negative erase word line decoding systems can suffer from latch-up due to difficulty in segregating the positive and the negative erase word line decoding circuitry. These two decoding circuits can interact with each other during switching, to the detriment of the EPROM/flash system. Excess current flow and even damage to the integrated circuit chip containing the decoding circuitry can result.

Thus, in a flash memory array, there is a need for a negative erase word line decoding system that may be implemented on-chip using less than five devices per word line. Further, such a negative erase word line decoding system should also minimize the possibility of latch-up, preferably by segregating the positive pull-up, and negative pull-down circuitry from each other.

The present invention discloses such an on-chip negative erase word line decoding system.

SUMMARY OF THE INVENTION

The present invention provides an on-chip positive and negative high voltage word line decoding system in which only three MOS transistors are used per word line. Latch-up is minimized by separating the positive high voltage and negative high voltage portions of the system using double-well fabrication on a common substrate.

The positive high voltage portion of the erase word line decoding system includes a native PMOS transistor fabricated in an N-well on the common P-substrate. The N-well is biased to about +10 VDC in program/write mode, to VCC in read mode, and is grounded in erase mode. The PMOS gate is coupled to an x-decoder internal signal that turns the PMOS transistor ON for selected word lines in write and read modes, but off otherwise. The PMOS drain is coupled to an associated word line, and the PMOS source floats. In program/write mode, the PMOS transistor pulls selected word lines up to about +10 VDC, and in read mode, up to VCC. Unselected word lines are not affected as the PMOS is turned off.

The negative high voltage portion of the erase word line decoding system includes first and second double-well NMOS transistors. These NMOS transistors that are each fabricated in a P-well within a separate N-well on the P-substrate. The NMOS sources and drains are parallel-coupled, an associated word line being coupled to the common drains. Both sources connected to virtual ground are coupled to ground except in erase mode for which coupling is to a −9 VDC potential for selected word lines. The P-wells are also coupled to ground except in erase mode for which coupling is to a −9 VDC potential for the selected word lines. The N-well is grounded at all times except for the test mode. In program/write and read modes, both NMOS transistors are OFF for selected word lines and ON for unselected word lines. In erase mode, both NMOS transistors are ON for selected word lines, but only the second NMOS transistor is ON for unselected word lines. Thus, in erase mode, both NMOS transistors pull an associated word line down to about −9 VDC, and the second NMOS transistor pulls an unselected word line down to ground.

Other features and advantages of the invention will appear from the following description in which the preferred embodiments have been set forth in detail in conjunction with the accompanying drawings.

DESCRIPTION OF THE PREFERRED EMBODIMENTS

Figure 1:
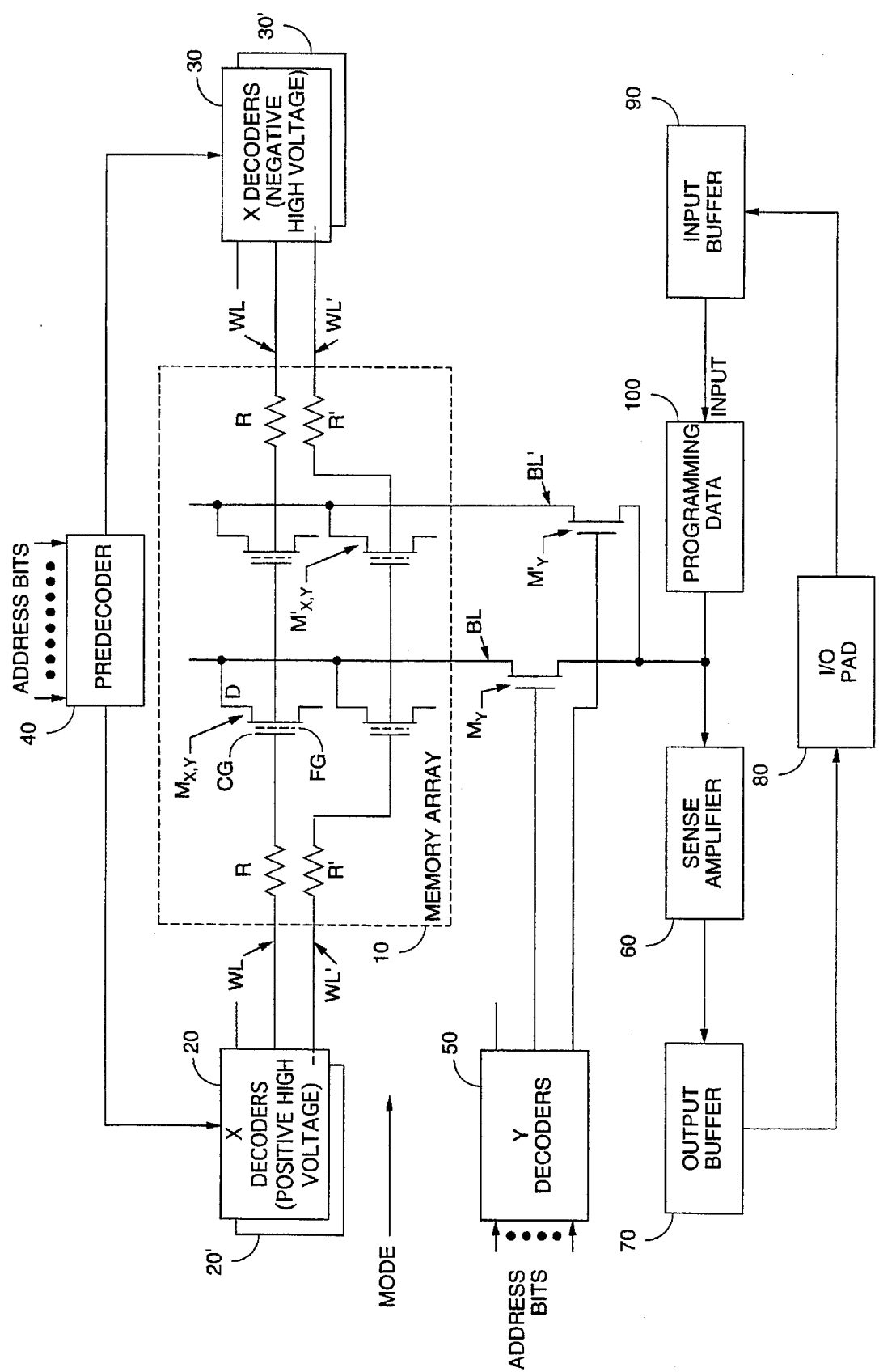
FIG. 1 depicts an EPROM/flash memory system, according to the present invention.

FIG. 1 is a block diagram of a flash memory cell architecture with which the present invention may be practiced. A memory array 10 includes a plurality of MOS memory cells such as cells $M_{x,y}$ and $M'_{x,y}$, each cell having source and drain regions, a floating gate (denoted FG) and a control gate (denoted CG). A plurality of such cells in a given horizontal (or x-axis) row have their control gates coupled together to form a word line (WL).

Each word line is selectively pulled-up or pulled-down to a program, read or erase voltage level by an x-axis positive high voltage decoder or by an x-axis negative high voltage decoder. Two word lines are shown in FIG. 1, WL being pulled-up or down by decoder 20 or 30, and word line WL' being pulled-up or down by decoder 20' or 30'. To minimize high voltage switching transients, each word line preferably includes an associated series resistance 2 R of a few KΩ.

Although only two word lines are shown in FIG. 1, the array 10 will include many word lines. In practice, it is common to treat groups of eight word lines as a common block, in which case there will be eight associated positive high voltage x-decoders and eight associated negative high voltage x-decoders.

A predecoder 40 receives input address information from a host device such as a microprocessor computing system (not shown) and outputs appropriate signals to the decoders, e.g., 20 and 30. In turn, the appropriate decoders will pull an associated word line up or down to a necessary voltage level.

More specifically, positive high voltage x-decoder 20 pulls a selected word line WL in memory array 10 up to about +10 VDC in program/write mode, and up to VCC (e.g., ≈+5 VDC) in read mode. Negative high voltage x-decoder 30 pulls the same word line WL down to about −9 VDC in erase mode (if the word line is selected), or down to 0 VDC if unselected in erase mode or in read mode. If word line 30 is unselected, in program/write mode, decoder 30 pulls the word line down to 0 VDC. Depending upon the potential to which selected word line WL is pulled by decoder 20 or by decoder 30, information in cell $M_{x,y}$ may be read out, erased, or new information may be programmed/written into this cell. This x-decoding system minimizes the possibility of latch-up by separating the positive and negative high voltage portions of the system.

A y-decoder 50 also receives address information from the host device. In conventional fashion, a plurality of cells in a column in the array have their source regions coupled together to form a bit line (BL). The output from y-decoder 50 turns-on a y-axis select transistor, e.g., $M_y$, which couples the bit line signal to the input of a sense amplifier 60 that reads the stored bit of information in the address-selected cell $M_{x,y}$. If instead cell $M'_{x,y}$ is to be read, y-decoder 50 will turn on select transistor $M'_y$. For ease of illustration, only two bit lines, BL and BL', are depicted in FIG. 1 although in practice array 10 will include a great many bit lines.

In a read mode of operation, the sense amplifier output is coupled through an output buffer 70. The "0" or "1" signal stored in an addressed cell $M_{x,y}$ is then provided to an input/output pad 80, from where the information may be accessed by the host device.

Data to be stored within the array 10 is coupled to the input/output pad 80 by the host device, from where the data are coupled to an input buffer 90. The output of buffer 90 is provided to an interface 100 that provides suitable programming data for the array. The system shown in FIG. 1 also receives from the host device signals commanding either a program/write mode, erase mode, or a read mode.

Figure 2:
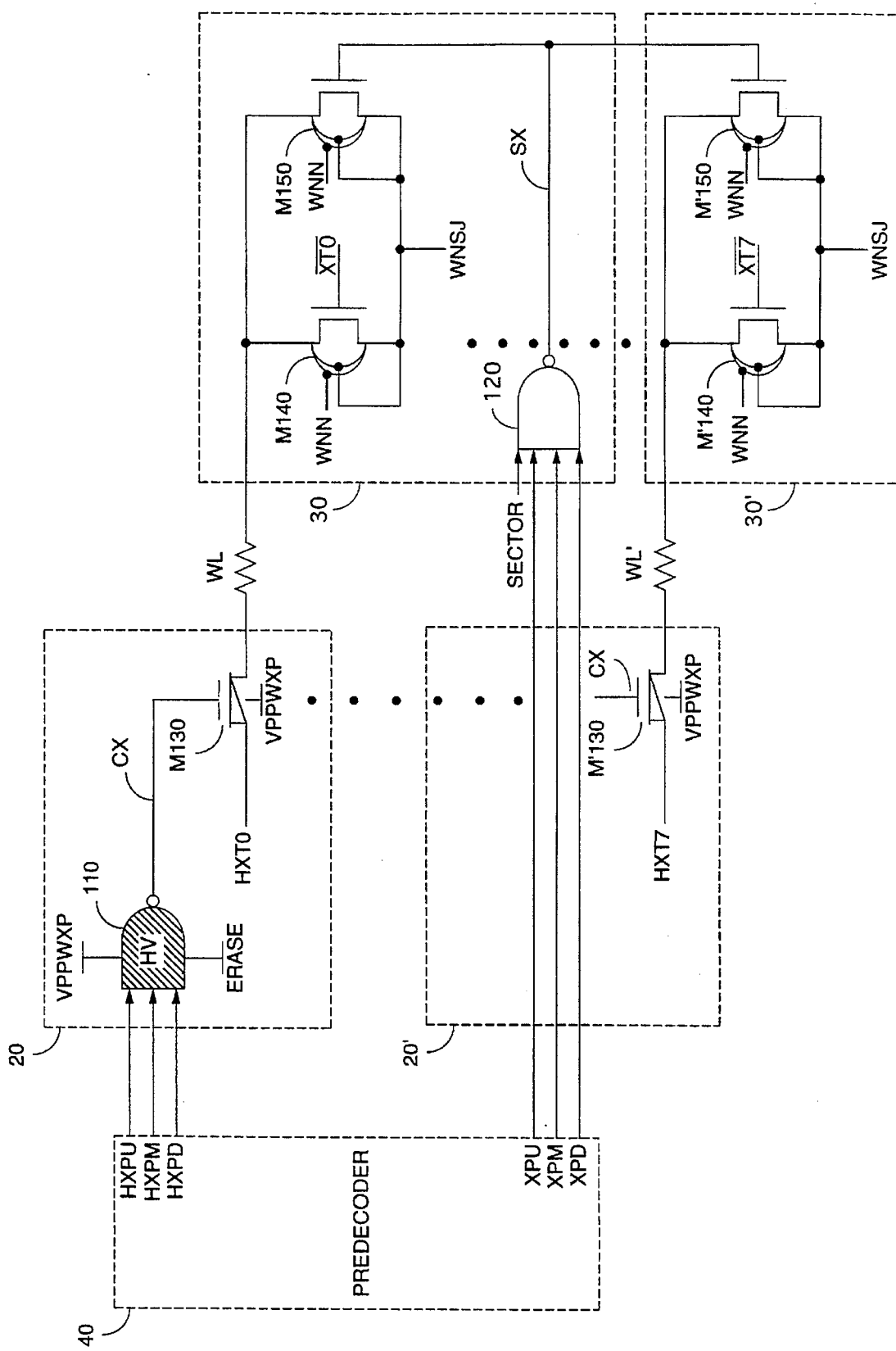
FIG. 2 depicts a predecoder and positive high voltage and negative high voltage x-decoders, according to the present invention.

FIG. 2 is a block diagram showing predecoder 40, as well as further details for x-decoders 30, 30' and 40, 40'. Predecoder 40 receives input signals from the host device (not shown) and outputs high level control signals (e.g., 0 VDC to about +10 VDC) to positive high voltage x-decoder 20, and outputs normal 0 V to VCC level control signals to the negative high voltage x-decoder 30.

With respect to the output signals from predecoder 40, the notation XPU, XPM and XPD denotes respective upper, middle and lower address bits. These signal levels range from 0 volts to VCC (or logical 0 to logical 1), where VCC is nominally the +5 VDC system power source to the integrated circuit chip containing the components shown in FIG. 1. Table 1, first row, shows the magnitude of these signals for the various program/write, erase and read modes of operation. The notation HXPU, HXPM and HXPD denotes similar upper, middle and lower address bit signals, except that the signal range is from "0" to a "1" that is higher than VCC, e.g., perhaps +10 VDC. Table 1, row 2, shows the magnitude of these signals for the various modes of operation.

Each positive high voltage x-decoder 20 shares the CX output signal from a high voltage ("HV") NAND-gate 110 and includes a PMOS transistor M130 that pulls-up the associated word line, when selected, to about +10 VDC in program/write mode, and to VCC in read mode. For ease of illustration, FIG. 2 depicts decoder 20 as including the high voltage NAND-gate 110, but preferably each set of eight decoders 20, 20', etc. share the same CX signal output by gate 110. The magnitude of CX is shown in Table 1, line 6. As shown by the last row in Table 1, NAND-gate 110 is powered by a voltage VPPWXP that is about +10 VDC in program/write mode, that is 0 VDC in erase mode, and that is VCC in read mode. NAND-gate 110 also receives a globally generated ERASE mode control signal.

Figure 3:
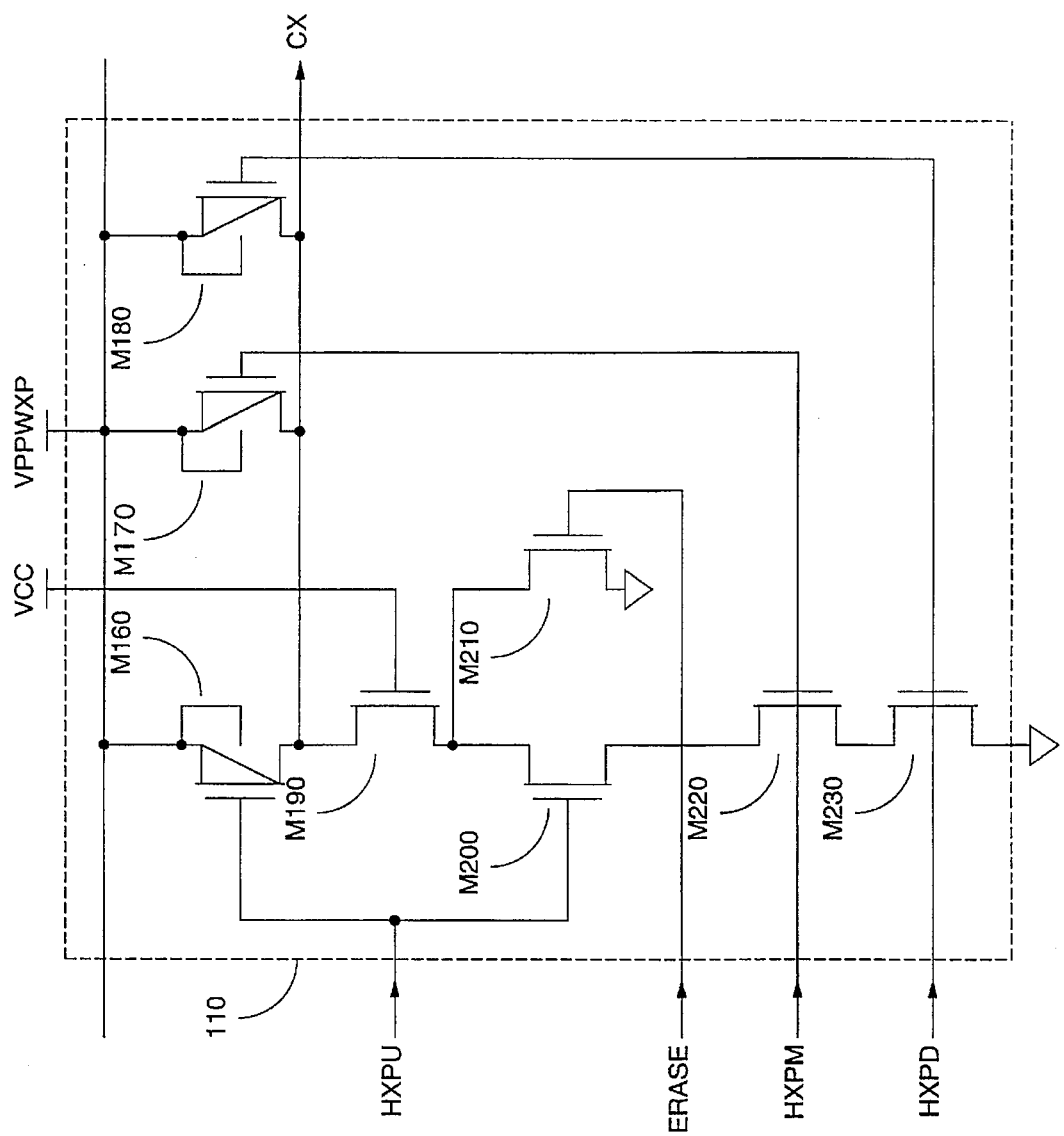
FIG. 3 is a schematic of the high voltage NAND gate used in the positive high voltage decoder of FIG. 2.

High voltage NAND-gate 110 is shown cross-hatched in FIG. 2 to denote that it is a shorthand representation, the full configuration for NAND-gate 110 being depicted in FIG. 3. As shown in FIG. 3, NAND-gate 110 includes three p-channel MOS transistors M160, M170, M180, and five n-channel MOS transistors M190, M200, M210, M220 and M230. Those skilled in the art of MOS logic gate design will appreciate that the output signal CX shown in Table 1, line 6 is provided by the circuitry shown.

M140 and M150 to be pulled up or down to the appropriate voltage level for programming/write, reading, or erase mode. This is in stark contrast to the prior art, in which five or more devices are required.

As further shown in FIG. 2, each negative high voltage x-decoder 30 includes two specially fabricated transistors M140, M150. Applicant's symbol for these transistors in FIG. 2 denotes that each is an NMOS device fabricated within a P-well (the inner curve, which is tied to the WNSJ node) that is within an N-well (the outer curve, which is tied to the WNN node) on the same P-substrate that contains PMOS transistor M130. The right-hand portion of FIG. 4 depicts the preferred fabrication of these double-well NMOS devices, fabrication for transistor M150 being depicted.

Figure 4:
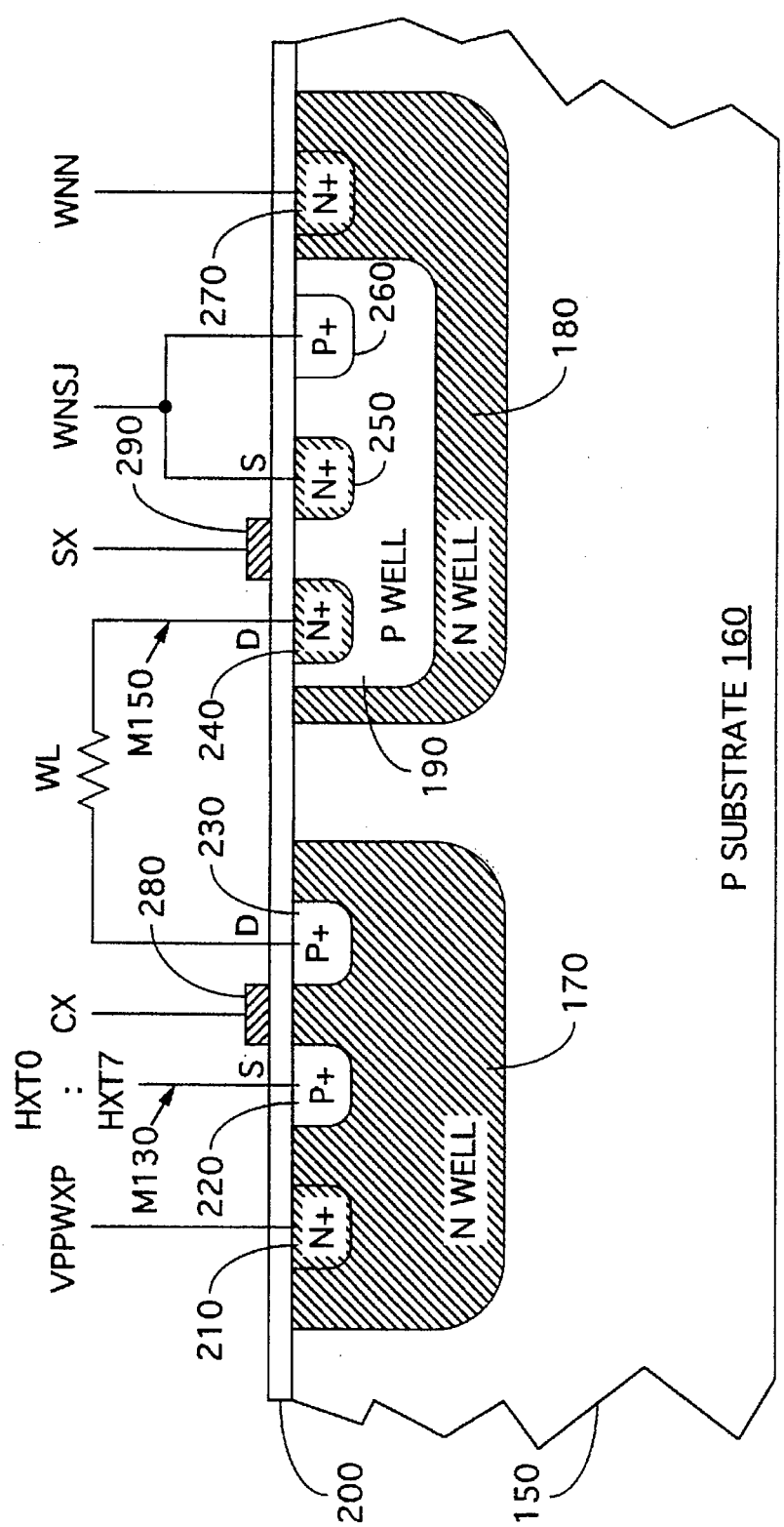
FIG. 4 is a cross-section of an integrated circuit chip showing fabrication of a high voltage PMOS transistor, and a single high voltage double-well NMOS transistor, according to the present invention.

As shown in FIG. 4, decoder transistors M130, M140, M150 (as well as M'130, M'140, M'150, etc.) are preferably fabricated on an integrated circuit chip 150 that includes a P-substrate 160. In the preferred embodiment, memory array 10 (FIG. 1) is also fabricated on the same integrated circuit

TABLE 1

| | | MODE | | | | | |
|---|---|---|---|---|---|---|---|
| | | Program/Write | | Erase | | Read | |
| SIGNAL | SIGNAL PURPOSE | sel. | unsel. | sel | unsel. | sel | unsel. |
| XPU/XPM/XPD | XP predecoders | all go Vcc | at 1st one 0 V | Vcc | Vcc | all go Vcc | at 1st one 0 V |
| HXPU/HXPM/HXPD | XP predecoders (goes to positive high voltage) | all go ≈10 V | at 1st one 0 V | Vcc | Vcc | all go Vcc | at 1st one 0 V |
| XT0# ... XT7# | XP predecoders (inverted output) | 0 V | Vcc as decod. | 0 V | 0 V | 0 V | Vcc as decod. |
| HXT0 ... HXT7 | XT predecoders (goes to positive high voltage) | ≈10 V | 0 V as decod. | 0 V | 0 V | VCC = 5 V | 0 V as decod. |
| SECTORj | Sector select signal | 5 V | 0 V | Vcc | 0 V | 5 V | 0 V |
| CX | X decoder internal signal (to 8 gates) | 0 V | ≈10 V as decod. | 0 V | 0 V | 0 V | Vcc as decod. |
| SX | X decoder internal signal (to 8 gates) | 0 V | Vcc as decod. | 0 V | 5 V | 0 V | Vcc as decod. |
| WNSj | Source for double-well NMOS transistor | 0 V | 0 V | −9 V | 0 V | 0 V | 0 V |
| WNN | Connect to N-well of double-well structure | 0 V | 0 V | 0 V | 0 V | 0 V | 0 V |
| ERASE | Erase control | 0 V | | Vcc | | 0 V | |
| VPPWXP | VPP/VCC switchable power for x-decoders (goes to positive high voltage) | ≈10 V | | 0 V | | Vcc | |

With further reference to FIG. 2, each positive high voltage x-decoder 20 includes a PMOS transistor M130, whose preferred fabrication is shown in FIG. 4.

It is understood from FIG. 2 that for an 8-bit block, there will be eight x-decoders 20, each receiving the same control signal CX. One of the eight decoders will be selected according to the state of control signals HXT0 ... HXT7 provided to the source of PMOS M130, thus selecting an associated word line for programming/writing, reading, or erasing. These individual control signals are generated from a 1-of-8 XT predecoder.

It will be appreciated from FIG. 2, that each word line advantageously requires but three devices, transistors M130, chip 150. First and second N-wells 170, 180 are formed, after which a P well 190 is formed within N well 180.

A thin oxide layer 200, N+ and P+ regions 210, 220, 230, 240, 250, 260, and 270, and gates 280 and 290 are formed. The PMOS transistor M130 includes source region 220, drain region 230 and gate 280. Source 220 is coupled to an HXT0 signal (see Table 1, row 4), drain 230 is coupled to word line WL, and gate 280 receives the common CX signal. Contact region 210 couples N-well 170 to VPPWXP, whose magnitudes are shown in Table 1, last row.

With reference to the right hand portion of FIG. 4, each double-well NMOS transistor M140 (and identically, M150) is fabricated within a P-well 190 that lies with the N-well 180. NMOS transistor M150 has a drain region 240 that is coupled to word line WL, a source region 250 that is coupled to a P+ contact region 260 that biases P-well 190 to the magnitude of control signal WNSj. As shown by Table 1, row 8, WNSj is 0 VDC except for a selected word line in erase mode, for which WNSj is –9 VDC. NMOS transistor M150 includes gate 290, which is coupled to receive the SX signal, whose values are shown in Table 1, row 7. N-well 180 is biased by contact region 270 to the potential of WNN, which is 0 VDC according to Table 1.

Table 2 summarizes operation of the positive and negative high voltage decoders 20, 30 for the various modes of operation. It is seen that using only three devices per word line (e.g., transistors M130, M140, M150) that each word line is pulled up or down to the appropriate voltage for program/writing, erasing, or reading. Further, the double-well fabrication shown in FIG. 4 advantageously separates the positive high voltage x-decoding components (e.g., transistor M130 in N-well 170) from the negative high voltage x-decoding components (e.g., M150 as well as M160), each in a separate P-well 190 within a separate N-well 180. The separation afforded by the double-well structure advantageously reduces integrated circuit chip area needed to implement the decoders, and also reduces latch-up.

TABLE 2

| COMPONENT | FUNCTION | Program/Write sel. | Program/Write unsel. | Erase sel. | Erase unsel. | Read sel. | Read unsel. |
|---|---|---|---|---|---|---|---|
| M130 | PMOS high voltage | ON | OFF | OFF | OFF | ON | OFF |
| M140 | double-well NMOS | OFF | ON | ON (≈–9 V) | OFF | OFF | ON |
| M150 | double-well NMOS | OFF | ON | ON (≈–9 V) | ON (0 V) | OFF | ON |
| WL | Word line | ≈10 V | 0 V | ≈–9 V | 0 V | Vcc | 0 V |

It is appreciated from Table 2 that in any given mode, either positive high voltage x-decoder 20, or negative high voltage x-decoder 30 operates to pull the associated selected word line up or down. PMOS transistor M130 pulls selected word line WL up to about +10 VDC in program/write mode, and to VCC in read mode, but is otherwise turned off. Together, NMOS transistors M140, M150 pull unselected word line WL down to 0 VDC in program/write mode, to 0 VDC in read mode, and pull selected word line WL down to –9 VDC in erase mode. In erase mode where word line WL is not selected, NMOS transistor 150 alone pulls the word line WL down to 0 VDC.

Modifications and variations may be made to the disclosed embodiments without departing from the subject and spirit of the invention as defined by the following claims.

What is claimed is:

1. In an EPROM/FLASH memory, an on-chip positive and negative high voltage word line decoding system configured to minimize latch-up within said memory by separating positive high voltage and negative high voltage portions of said system using double-well fabrication on a common substrate, said positive and negative high voltage portions being used respectively to program and erase said memory, wherein said positive and negative high voltage portions are physically distinct, said positive high voltage portion generates positive word line control signals that cause a first set of selected word lines to be pulled-up to positive voltage and said negative high voltage portion generates negative word line control signals that cause a second set of selected word lines to be pulled-down to negative voltage.

2. The system of claim 1, wherein said positive high voltage portion of said erase word line decoding system comprises a PMOS transistor having a gate, drain and source fabricated in an N-well on a common P-substrate.

3. The system of claim 2, wherein:
   said N-well is biased to positive high voltage in program/write mode, to VCC in read mode and is grounded in erase mode;
   said PMOS transistor gate is coupled to one of said positive word line control signals that turns said PMOS transistor ON for said first set of selected word lines in program/write and read modes, but off otherwise;
   said PMOS transistor drain is coupled to an associated word line; and
   said PMOS transistor source is coupled to a x-decoder generated control signal that in said program/write mode is at said positive high voltage for said first set of selected word lines and, in said read mode, is at VCC for said first set of selected word lines and is otherwise grounded;
   such that, in said program/write mode, said PMOS transistor pulls said first set of selected word lines up to said positive high voltage and, in said read mode, pulls said first set of selected word lines up to VCC.

4. The system of claim 3, wherein said positive high voltage is approximately equal to +10 VDC.

5. The system of claim 2, wherein said positive high voltage portion further comprises a high voltage NAND gate with inputs driven by predecoder select signals, an erase signal and a switchable positive voltage signal, said NAND gate generating one of said positive word line control signals as a function of said inputs, wherein:
   when said switchable positive voltage signal is set to positive high voltage (VPP) and said erase signal is grounded: when said select signals are all set to said VPP, said generated control signal is grounded and, when at least one of said select signals is grounded, said generated control signal is set to said VPP;
   when said switchable positive voltage signal is grounded, said erase signal is set to VCC and said select signals are all set to said VPP: said generated control signal is grounded; and
   when said switchable positive voltage signal is set to VCC and said erase signal is grounded: when said select signals are all set to said VCC, said generated control signal is grounded and, when at least one of said select signals is grounded, said generated control signal is set to said VCC.

6. The system of claim 1, wherein said negative high voltage portion of the erase word line decoding system comprises first and second double-well NMOS transistors, each having a source, drain and gate.

7. The system of claim 6, wherein:
said double-well NMOS transistors are each fabricated in a P-well within a separate N-well on a common P-substrate;
said NMOS sources and drains are parallel-coupled, an associated word line being coupled to their common drains and both sources being coupled to circuit ground except in erase mode for which their coupling is to a negative voltage for said second set of selected word lines;
said P-wells are also coupled to said circuit ground except in said erase mode for which their coupling is to negative voltage for said second set of selected word lines; and
said N-well is grounded at all times during normal operation of said memory;
such that, in program/write and read modes, both said NMOS transistors are OFF for said second set of selected word lines and ON for unselected word lines and, in said erase mode, said NMOS transistors are ON for said second set of selected word lines, but only said second NMOS transistor is ON for unselected word lines so that, in said erase mode, said NMOS transistors pull a selected line down to said negative voltage, and said second NMOS transistor couples an unselected word line to said circuit ground.

8. The system of claim 6, wherein said negative voltage is substantially less than said ground and approximately equal to −9 VDC.

9. In an EPROM/FLASH memory, an on-chip positive and negative high voltage word line decoding system configured to minimize latch-up within said memory by separating positive high voltage and negative high voltage portions of said system using double-well fabrication on a common substrate, said positive and negative high voltage portions being used respectively to program and erase said memory, wherein:
said positive high voltage portion of said erase word line decoding system comprises a PMOS transistor having a gate, drain and source fabricated in an N-well on a common P-substrate;
said N-well is biased to positive high voltage in program/write mode, to VCC in read mode and is grounded in erase mode;
said PMOS transistor gate is coupled to an x-decoder internal signal that turns said PMOS transistor ON for selected word lines in program/write and read modes, but off otherwise;
said PMOS transistor drain is coupled to an associated word line; and
said PMOS transistor source is coupled to a x-decoder generated control signal that in said program/write mode is at said positive high voltage for said selected word lines and, in said read mode, is at VCC for selected word lines and is otherwise grounded;
such that, in said program/write mode, said PMOS transistor pulls said selected word lines up to said positive high voltage and, in said read mode, pulls said selected word lines up to VCC.

10. The system of claim 9, wherein said positive high voltage is approximately equal to +10 VDC.

11. In an EPROM/FLASH memory, an on-chip positive and negative high voltage word line decoding system configured to minimize latch-up within said memory by separating positive high voltage and negative high voltage portions of said system using double-well fabrication on a common substrate, said positive and negative high voltage portions being used respectively to program and erase said memory, wherein:
said positive high voltage portion of said erase word line decoding system comprises a PMOS transistor having a gate, drain and source fabricated in an N-well on a common P-substrate;
said positive high voltage portion further comprises a high voltage NAND gate with inputs driven by predecoder select signals, an erase signal and a switchable positive voltage signal, said NAND gate generating a control signal as a function of said inputs, such that:
when said switchable positive voltage signal is set to positive high voltage (VPP) and said erase signal is grounded: when said select signals are all set to said VPP, said control signal is grounded and, when at least one of said select signals is grounded, said control signal is set to said VPP;
when said switchable positive voltage signal is grounded, said erase signal is set to VCC and said select signals are all set to said VPP: said control signal is grounded; and
when said switchable positive voltage signal is set to VCC and said erase signal is grounded: when said select signals are all set to said VCC, said control signal is grounded and, when at least one of said select signals is grounded, said control signal is set to said VCC.

12. In an EPROM/FLASH memory, an on-chip positive and negative high voltage word line decoding system configured to minimize latch-up within said memory by separating positive high voltage and negative high voltage portions of said system using double-well fabrication on a common substrate, said positive and negative high voltage portions being used respectively to program and erase said memory, wherein:
said negative high voltage portion of the erase word line decoding system comprises first and second double-well NMOS transistors, each having a source, drain and gate;
said double-well NMOS transistors are each fabricated in a P-well within a separate N-well on a common P-substrate;
said NMOS sources and drains are parallel-coupled, an associated word line being coupled to their common drains and both sources being coupled to circuit ground except in erase mode for which their coupling is to a negative voltage for selected word lines;
said P-wells are also coupled to said circuit ground except in said erase mode for which their coupling is to negative voltage for said selected word lines; and
said N-well is grounded at all times during normal operation of said memory;
such that, in program/write and read modes, both said NMOS transistors are OFF for said selected word lines and ON for unselected word lines and, in said erase mode, said NMOS transistors are ON for said selected word lines, but only said second NMOS transistor is ON for unselected word lines so that, in said erase mode, said NMOS transistors pull a selected line down to said negative voltage, and said second NMOS transistor couples an unselected word line to said circuit ground.

* * * * *